(12) United States Patent
Cong et al.

(10) Patent No.: US 12,716,777 B2
(45) Date of Patent: Aug. 25, 2026

(54) SYSTEMS, APPARATUS, AND METHODS FOR MONITORING PLATE TEMPERATURE FOR SEMICONDUCTOR MANUFACTURING

(71) Applicant: Applied Materials, Inc., Santa Clara, CA (US)

(72) Inventors: Zhepeng Cong, San Jose, CA (US); Nimrod Smith, Cupertino, CA (US); Ashur J. Atanos, San Jose, CA (US); Tao Sheng, Santa Clara, CA (US)

(73) Assignee: Applied Materials, Inc., Santa Clara, CA (US)

( * ) Notice: Subject to any disclaimer, the term of this patent is extended or adjusted under 35 U.S.C. 154(b) by 530 days.

(21) Appl. No.: 18/132,861

(22) Filed: Apr. 10, 2023

(65) Prior Publication Data

US 2024/0337537 A1 Oct. 10, 2024

(51) Int. Cl.

| | |
|---|---|
| ***G01J 5/00*** | (2022.01) |
| ***C23C 16/458*** | (2006.01) |
| ***C23C 16/46*** | (2006.01) |
| ***G01J 5/08*** | (2022.01) |
| ***G01J 5/0801*** | (2022.01) |

(52) U.S. Cl.

CPC .......... *G01J 5/0007* (2013.01); *C23C 16/458* (2013.01); *C23C 16/46* (2013.01); *G01J 5/0801* (2022.01); *G01J 5/0879* (2022.01)

(58) Field of Classification Search

None

See application file for complete search history.

(56) References Cited

U.S. PATENT DOCUMENTS

| | | | | |
|---|---|---|---|---|
| 4,956,538 | A * | 9/1990 | Moslehi ................ | G01J 3/0243 374/161 |
| 9,469,918 | B2 | 10/2016 | Xu et al. | |
| 10,159,113 | B2 | 12/2018 | Möench et al. | |
| 10,443,129 | B2 | 10/2019 | Mori et al. | |
| 10,957,564 | B2 | 3/2021 | Li et al. | |
| 11,359,972 | B2 | 6/2022 | Cong et al. | |
| 2004/0144323 | A1 | 7/2004 | Kai | |
| 2004/0168627 | A1 | 9/2004 | Conley et al. | |
| 2012/0263875 | A1 | 10/2012 | Brenninger et al. | |
| 2014/0261159 | A1 | 9/2014 | Okabe et al. | |

(Continued)

OTHER PUBLICATIONS

International Search Report and Written Opinion dated May 17, 2024 for Application No. PCT/US2024/011884.

*Primary Examiner* — Erica S Lin

(74) *Attorney, Agent, or Firm* — Patterson + Sheridan, LLP

(57) ABSTRACT

The present disclosure relates to systems, apparatus, and methods for monitoring plate temperature for semiconductor manufacturing. In one or more embodiments, a system for processing substrates and applicable for semiconductor manufacturing includes a chamber body including one or more sidewalls. The system includes a lid and a window, the one or more sidewalls, the window, and the lid at least partially defining an internal volume. The system includes one or more heat sources configured to heat the internal volume, a substrate support disposed in the internal volume, and a first optical sensor configured to detect energy having a first wavelength that is less than 4.0 microns. The system includes a second optical sensor configured to detect energy having a second wavelength that is less than the first wavelength.

19 Claims, 10 Drawing Sheets

(56) References Cited

U.S. PATENT DOCUMENTS

2015/0155190 A1* 6/2015 Miller .............. H01L 21/67248 219/400
2022/0325400 A1 10/2022 Cong et al.
2023/0131233 A1* 4/2023 Lavdovsky ....... H01L 21/67069 438/795

* cited by examiner

SYSTEMS, APPARATUS, AND METHODS FOR MONITORING PLATE TEMPERATURE FOR SEMICONDUCTOR MANUFACTURING

BACKGROUND

Field

The present disclosure relates to systems, apparatus, and methods for monitoring plate temperature for semiconductor manufacturing.

Description of the Related Art

Semiconductor substrates are processed for a wide variety of applications, including the fabrication of integrated devices and microdevices. During processing, various parameters can affect the uniformity of material deposited on the substrate. For example, the temperature of the substrate and/or temperature(s) of processing chamber component(s) can affect deposition uniformity.

It can be difficult to adjust parameters (such as gas flow paths, gas flow rates and gas pressures) for deposition uniformity. Rotation of the substrate, if used, can exacerbate adjustment difficulties. Relatively low rotation speeds, high pressures, and low flow rates can also exacerbate adjustment difficulties. Moreover, it can be difficult to clean components of processing chambers.

Efforts to address such difficulties can involve difficulties of monitoring temperatures of the substrate and/or chamber components. Efforts can also involve difficulties of monitoring coating of chamber component(s).

Therefore, a need exists for improved processing chamber and related components that facilitate adjusting process parameters and monitoring temperatures and coating conditions.

SUMMARY

The present disclosure relates to systems, apparatus, and methods for monitoring plate temperature for semiconductor manufacturing.

In one or more embodiments, a system for processing substrates and applicable for semiconductor manufacturing includes a chamber body including one or more sidewalls. The system includes a lid and a window, the one or more sidewalls, the window, and the lid at least partially defining an internal volume. The system includes one or more heat sources configured to heat the internal volume, a substrate support disposed in the internal volume, and a first optical sensor configured to detect energy having a first wavelength that is less than 4.0 microns. The system includes a second optical sensor configured to detect energy having a second wavelength that is less than the first wavelength.

In one or more embodiments, a system for processing substrates and applicable for semiconductor manufacturing includes a chamber body including one or more sidewalls. The system includes a lid and a window, the one or more sidewalls, the window, and the lid at least partially defining an internal volume, and the window includes a first quartz. The system includes one or more heat sources configured to heat the internal volume, a substrate support disposed in the internal volume, and a plate disposed in the internal volume between the substrate support and the window. The plate includes a second quartz, and the second quartz has a second hydroxyl concentration of more than 750 ppm.

In one or more embodiments, a system for processing substrates and applicable for semiconductor manufacturing includes a chamber body including one or more sidewalls. The system includes a lid and a window, the one or more sidewalls, the window, and the lid at least partially defining an internal volume. The system includes one or more heat sources configured to heat the internal volume, a substrate support disposed in the internal volume, and a plate disposed in the internal volume between the substrate support and the window. The system includes a controller including instructions that, when executed, cause a plurality of operations to be conducted, the plurality of operations include heating a substrate supported at least partially by the substrate support, and flowing one or more process gases over the substrate to form one or more layers on the substrate. The plurality of instructions include monitoring a first temperature of the substrate or the substrate support using the first optical sensor, and monitoring a second temperature of the plate using the second optical sensor.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure relates to systems, apparatus, and methods for monitoring plate temperature for semiconductor manufacturing.

The disclosure contemplates that terms such as "couples," "coupling," "couple," and "coupled" may include but are not limited to welding, fusing, melting together, interference fitting, and/or fastening such as by using bolts, threaded connections, pins, and/or screws. The disclosure contemplates that terms such as "couples," "coupling," "couple," and "coupled" may include but are not limited to integrally forming. The disclosure contemplates that terms such as "couples," "coupling," "couple," and "coupled" may include but are not limited to direct coupling and/or indirect coupling, such as indirect coupling through components such as links, blocks, and/or frames.

Figure 1:
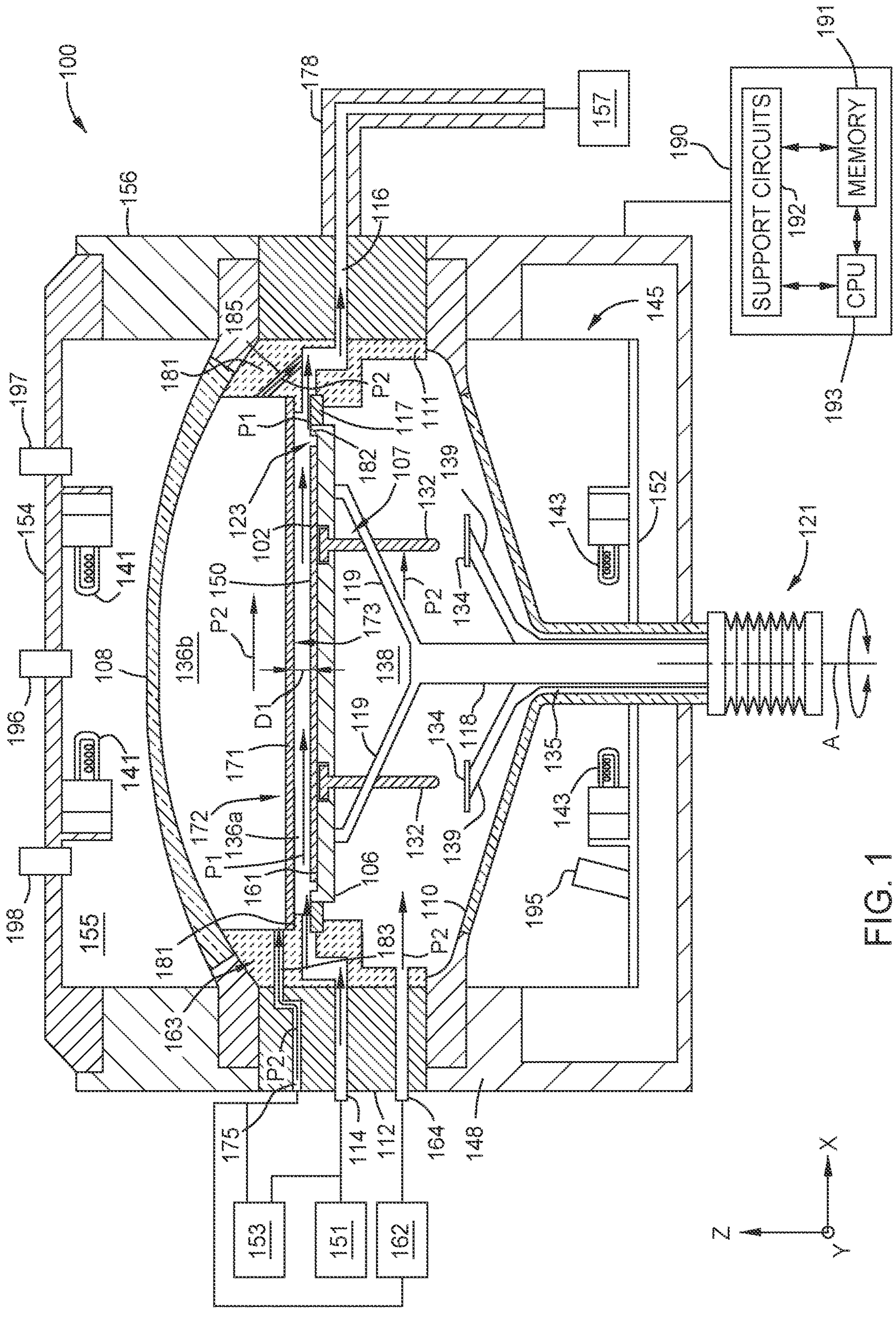
FIG. 1 is a schematic side cross-sectional view of a processing chamber, according to one or more embodiments.

FIG. 1 is a schematic side cross-sectional view of a processing chamber 100, according to one or more embodiments. The processing chamber 100 is a deposition chamber. In one or more embodiments, the processing chamber 100 is an epitaxial deposition chamber. The processing chamber 100 is utilized to grow an epitaxial film on a substrate 102. The processing chamber 100 creates a cross-flow of precursors across a top surface 150 of the substrate 102. The processing chamber 100 is shown in a processing condition in FIG. 1.

The processing chamber 100 includes an upper body 156, a lower body 148 disposed below the upper body 156, and a flow module 112 disposed between the upper body 156 and the lower body 148. The upper body 156, the flow module 112, and the lower body 148 form a chamber body. Disposed within the chamber body is a substrate support 106, an upper window 108 (such as an upper dome), a lower window 110 (such as a lower dome), a plurality of upper heat sources 141, and a plurality of lower heat sources 143. In one or more embodiments, the upper heat sources 141 include upper lamps and the lower heat sources 143 include lower lamps. The present disclosure contemplates that other heat sources may be used (in addition to or in place of the lamps) for the various heat sources described herein. For example, resistive heaters, light emitting diodes (LEDs), and/or lasers may be used for the various heat sources described herein.

The substrate support 106 is disposed between the upper window 108 and the lower window 110. The substrate support 106 supports the substrate 102. In one or more embodiments, the substrate support 106 includes a susceptor. Other substrate supports (including, for example, a substrate carrier and/or one or more ring segment(s) that support one or more outer regions of the substrate 102) are contemplated by the present disclosure. The plurality of upper heat sources 141 are disposed between the upper window and a lid 154. The plurality of upper heat sources 141 form a portion of the upper heat source module 155. The lid 154 includes a plurality of sensor devices 196, 197, 198 disposed therein or thereon and configured to measures temperature(s) within the processing chamber 100. A lower sensor device 195 is configured to measure temperature(s) within the processing chamber 100. In one or more embodiments, each sensor device 195, 196, 197, 198 is a pyrometer. In one or more embodiments, each sensor device 195, 196, 197, 198 is an optical sensor device, such as an optical pyrometer. The present disclosure contemplates that sensors other than pyrometers may be used. Each sensor device 195, 196, 197, 198 is a single-wavelength sensor device or a multi-wavelength (such as dual-wavelength) sensor device. The lower sensor device 195 is disposed adjacent to the floor 152.

In one or more embodiments, the process chamber 100 includes any one, any two, or any three of the four illustrated sensor devices 195, 196, 197, 198.

In one or more embodiments, the process chamber 100 includes one or more additional sensor devices, in addition to the sensor devices 195, 196, 197, 198. In one or more embodiments, the process chamber 100 may include sensor devices disposed at different locations and/or with different orientations than the illustrated sensor devices 195, 196, 197, 198.

The plurality of lower heat sources 143 are disposed between the lower window 110 and a floor 152. The plurality of lower heat sources 143 form a portion of a lower heat source module 145. The upper window 108 is an upper dome and/or is formed of an energy transmissive material, such as quartz. The lower window 110 is a lower dome and/or is formed of an energy transmissive material, such as quartz.

An upper volume 136 and a purge volume 138 are formed between the upper window 108 and the lower window 110. The upper volume 136 and the purge volume 138 are part of an internal volume defined at least partially by the upper window 108, the lower window 110, and one or more liners 111, 163.

The internal volume has the substrate support 106 disposed therein. The substrate support 106 includes a top surface on which the substrate 102 is disposed. The substrate support 106 is attached to a shaft 118. In one or more embodiments, the substrate support 106 is connected to the shaft 118 through one or more arms 119 connected to the shaft 118. The shaft 118 is connected to a motion assembly 121. The motion assembly 121 includes one or more actuators and/or adjustment devices that provide movement and/or adjustment for the shaft 118 and/or the substrate support 106 within the upper volume 136.

The substrate support 106 may include lift pin holes 107 disposed therein. The lift pin holes 107 are each sized to accommodate a lift pin 132 for lifting of the substrate 102 from the substrate support 106 before or after a deposition process is performed. The lift pins 132 may rest on lift pin stops 134 when the substrate support 106 is lowered from a process position to a transfer position. The lift pin stops 134 can include a plurality of arms 139 that attach to a shaft 135.

The flow module 112 includes one or more gas inlets 114 (e.g., a plurality of gas inlets), one or more purge gas inlets 164 (e.g., a plurality of purge gas inlets), and one or more gas exhaust outlets 116. The one or more gas inlets 114 and the one or more purge gas inlets 164 are disposed on the opposite side of the flow module 112 from the one or more gas exhaust outlets 116. A pre-heat ring 117 is disposed below the one or more gas inlets 114 and the one or more gas exhaust outlets 116. The pre-heat ring 117 is disposed above the one or more purge gas inlets 164. The one or more liners 111, 163 are disposed on an inner surface of the flow module 112 and protects the flow module 112 from reactive gases used during deposition operations and/or cleaning operations. The gas inlet(s) 114 and the purge gas inlet(s) 164 are each positioned to flow a respective one or more process gases P1 and one or more purge gases P2 parallel to the top surface 150 of a substrate 102 disposed within the upper volume 136. The gas inlet(s) 114 are fluidly connected to one or more process gas sources 151 and one or more cleaning gas sources 153. The purge gas inlet(s) 164 are fluidly connected to one or more purge gas sources 162. The one or more gas exhaust outlets 116 are fluidly connected to an exhaust pump 157. The one or more process gases P1 supplied using the one or more process gas sources 151 can include one or more reactive gases (such as one or more of silicon (Si), phosphorus (P), and/or germanium (Ge)) and/or one or more carrier gases (such as one or more of nitrogen ($N_2$) and/or hydrogen ($H_2$)). The one or more purge gases P2 supplied using the one or more purge gas sources 162 can include one or more inert gases (such as one or more of argon (Ar), helium (He), and/or nitrogen ($N_2$)). One or more cleaning gases supplied using the one or more cleaning gas sources 153 can include one or more of hydrogen (H) and/or chlorine (CI). In one or more embodiments, the one or more process gases P1 include silicon phosphide (SiP) and/or phospine ($PH_3$), and the one or more cleaning gases include hydrochloric acid (HCl).

The one or more gas exhaust outlets 116 are further connected to or include an exhaust system 178. The exhaust system 178 fluidly connects the one or more gas exhaust outlets 116 and the exhaust pump 157. The exhaust system 178 can assist in the controlled deposition of a layer on the substrate 102. The exhaust system 178 is disposed on an opposite side of the processing chamber 100 relative to the flow module 112.

A includes a plate 171 having a first face 172 and a second face 173 opposing the first face 172. In one or more embodiments, the plate 171 is part of a flow guide structure. The second face 173 faces the substrate support 106. The processing chamber 100 includes the one or more liners 111, 163. An upper liner 163 includes an annular section 181 and one or more ledges 182 extending inwardly relative to the annular section 181. The one or more ledges 182 are configured to support one or more outer regions of the second face 173 of the plate 171. The upper liner 163 includes one or more inlet openings 183 and one or more outlet openings 185. In one or more embodiments, the plate 171 is in the shape of a disc, and the annular section 181 is in the shape of a ring. The plate 171 can be in the shape of a rectangle. The plate 171 divides the upper volume 136 between the substrate support 106 and the upper window 108 into a lower portion **136*a* and an upper portion 136*b*. The lower portion 136*a* is a processing portion. In one or more embodiments, the plate 171 is an isolation plate that fluidly isolates the upper portion 136*b* from the lower portion 136*a***.

The flow module 112 (which can be at least part of a sidewall of the processing chamber 100) includes the one or more gas inlets 114 in fluid communication with the lower portion **136*a*. The flow module 112 includes one or more second gas inlets 175 in fluid communication with the upper portion 136*b*. The one or more gas inlets 114 are in fluid communication with one or more flow gaps between the upper liner 163 and a lower liner 111. The one or more second gas inlets 175 are in fluid communication with the one or more inlet openings 183 of the upper liner 163**.

During a deposition operation (e.g., an epitaxial growth operation), the one or more process gases P1 flow through the one or more gas inlets 114, through the one or more gaps, and into the lower portion **136*a* to flow over the substrate 102. During the deposition operation, one or more purge gases P2 flow through the one or more second gas inlets 175, through the one or more inlet openings 183 of the lower liner 111, and into the upper portion 136*b*. The one or more purge gases P2 flow simultaneously with the flowing of the one or more process gases P1. The flowing of the one or more purge gases P2 through the upper portion 136*b* facilitates reducing or preventing flow of the one or more process gases P1 into the upper portion 136*b* that would contaminate the upper portion 136*b*. The one or more process gases P1 are exhausted through gaps between the upper liner 163 and the lower liner 111, and through the one or more gas exhaust outlets 116. The one or more purge gases P2 are exhausted through the one or more outlet openings 185, through the same gaps between the upper liner 163 and the lower liner 111, and through the same one or more gas exhaust outlets 116 as the one or more process gases P1. The present disclosure contemplates that that one or more purge gases P2 can be separately exhausted through one or more second gas exhaust outlets that are separate from the one or more gas exhaust outlets 116**.

The present disclosure also contemplates that the one or more purge gases P2 can be supplied to the purge volume 138 (through the one or more purge gas inlets 164) during the deposition operation, and exhausted from the purge volume 138.

During a cleaning operation, one or more cleaning gases flow through the one or more gas inlets 114, through the one or more gaps (between the upper liner 163 and the lower liner 111), and into the lower portion **136*a*. During the cleaning operation, one or more cleaning gases also simultaneously flow through the one or more second gas inlets 175, through the one or more inlet openings 183 of the upper liner 163, and into the upper portion 136*b*. The present disclosure contemplates that the one or more cleaning gases used to clean surfaces adjacent the upper portion 136*b* can be the same as or different than the one or more cleaning gases used to clean surfaces adjacent the lower portion 136*a***.

The processing chamber 100 facilitates separating the gases provided to the lower portion **136*a* from the gases provided to the upper portion 136*b*, which facilitates parameter adjustability. Additionally, one or more purge gases and one or more cleaning gases can be separately provided to the upper portion 136*b* to facilitate reduced contamination of the upper window 108 and/or the plate 171**.

As shown, a controller 190 is in communication with the processing chamber 100 and is used to control processes and methods, such as the operations of the methods described herein.

The controller 190 is configured to receive data or input as sensor readings from a plurality of sensors. The sensors can include, for example: sensors that monitor growth of layer(s) on the substrate 102; sensors that monitor growth or residue on inner surfaces of chamber components of the processing chamber 100 (such as inner surfaces of the plate 171 and/or the one or more liners 111, 163); and/or sensors that monitor temperatures of the substrate 102, the substrate support 106, the plate 171, and/or the liners 111, 163. The controller 190 is equipped with or in communication with a system model of the processing chamber 100. The system model includes a heating model, a coating model, a rotational position model, and/or a gas flow model. The system model is a program configured to estimate parameters (such as a gas flow rate, a gas pressure, a processing temperature, a rotational position of component(s), a heating profile, a coating condition, and/or a cleaning condition) within the processing chamber 100 throughout a deposition operation and/or a cleaning operation. The controller 190 is further configured to store readings and calculations. The readings and calculations include previous sensor readings, such as any previous sensor readings within the processing chamber 100. The readings and calculations further include the stored calculated values from after the sensor readings are measured by the controller 190 and run through the system model. Therefore, the controller 190 is configured to both retrieve stored readings and calculations as well as save readings and calculations for future use. Maintaining previous readings and calculations enables the controller 190 to adjust the system model over time to reflect a more accurate version of the processing chamber 100.

The controller 190 can monitor, estimate an optimized parameter, detect a coating condition for the plate 171, generate an alert on a display, halt a deposition operation, initiate a chamber downtime period, delay a subsequent iteration of the deposition operation, initiate a cleaning operation, detect a cleaning condition for the plate 171, halt the cleaning operation, adjust a heating power, and/or otherwise adjust the process recipe.

The controller 190 includes a central processing unit (CPU) 193 (e.g., a processor), a memory 191 containing instructions, and support circuits 192 for the CPU 193. The controller 190 controls various items directly, or via other computers and/or controllers. In one or more embodiments, the controller 190 is communicatively coupled to dedicated controllers, and the controller 190 functions as a central controller.

The controller 190 is of any form of a general-purpose computer processor that is used in an industrial setting for controlling various substrate processing chambers and equipment, and sub-processors thereon or therein. The memory 191, or non-transitory computer readable medium, is one or more of a readily available memory such as random access memory (RAM), dynamic random access memory (DRAM), static RAM (SRAM), and synchronous dynamic RAM (SDRAM (e.g., DDR1, DDR2, DDR3, DDR3L, LPDDR3, DDR4, LPDDR4, and the like)), read only memory (ROM), floppy disk, hard disk, flash drive, or any other form of digital storage, local or remote. The support circuits 192 of the controller 190 are coupled to the CPU 193 for supporting the CPU 193. The support circuits 192 include cache, power supplies, clock circuits, input/output circuitry and subsystems, and the like. Operational parameters (e.g., the coating condition, a pressure for process gases P1, a processing temperature, a heating profile, a flow rate for process gases P1, a pressure for cleaning gases, a flow rate for cleaning gases, and/or a rotational position of a the substrate support 106) and operations are stored in the memory 191 as a software routine that is executed or invoked to turn the controller 190 into a specific purpose controller to control the operations of the various chambers/modules described herein. The controller 190 is configured to conduct any of the operations described herein. The instructions stored on the memory, when executed, cause one or more of operations of method 1000 and/or the method 1100 (described below) to be conducted in relation to the processing chamber 100. The controller 190 and the processing chamber 100 are at least part of a system for processing substrates.

The various operations described herein (such as the operations of the method 1000 and/or the method 1100) can be conducted automatically using the controller 190, or can be conducted automatically or manually with certain operations conducted by a user.

In one or more embodiments, the controller 190 includes a mass storage device, an input control unit, and a display unit. The controller 190 monitors the temperature of the substrate 102, the temperature of the substrate support 106, the temperature of the plate 171, the process gas flow, and/or the purge gas flow. In one or more embodiments, the controller 190 includes multiple controllers 190, such that the stored readings and calculations and the system model are stored within a separate controller from the controller 190 which controls the operations of the processing chamber 100. In one or more embodiments, all of the system model and the stored readings and calculations are saved within the controller 190.

The controller 190 is configured to control the sensor devices 195, 196, 197, 198, the deposition, the cleaning, the rotational position, the heating, and gas flow through the processing chamber 100 by providing an output to the controls for the heat sources, the gas flow, and the motion assembly 121. The controls include controls for the sensor devices 195, 196, 197, 198, the upper heat sources 141, the lower heat sources 143, the process gas source 151, the purge gas source 162, the motion assembly 121, and the exhaust pump 157.

The controller 190 is configured to adjust the output to the controls based on the sensor readings, the system model, and the stored readings and calculations. The controller 190 includes embedded software and a compensation algorithm to calibrate measurements. The controller 190 can include one or more machine learning algorithms and/or artificial intelligence algorithms that estimate optimized parameters for the deposition operations and/or the cleaning operations (such as for adjusting a deposition operation (e.g. the process recipe), halting the deposition operation, initiating a chamber downtime period, delaying a subsequent iteration of the deposition operation, initiating a cleaning operation, halting the cleaning operation, adjusting a heating power, and/or adjusting the cleaning operation). The optimized parameter can include, for example, a pre-determined coating thickness on the plate 171 that initiates a cleaning operation to remove the coating from the plate 171.

The one or more machine learning algorithms and/or artificial intelligence algorithms may implement, adjust and/or refine one or more algorithms, inputs, outputs or variables described above. Additionally or alternatively, the one or more machine learning algorithms and/or artificial intelligence algorithms may rank or prioritize certain aspects of adjustments of the process chamber 100, the method 1000, and/or the method 1100 relative to other aspects of the process chamber 100, the method 1000, and/or the method 1100. The one or more machine learning algorithms and/or artificial intelligence algorithms may account for other changes within the processing systems such as hardware replacement and/or degradation. In one or more embodiments, the one or more machine learning algorithms and/or artificial intelligence algorithms account for upstream or downstream changes that may occur in the processing system due to variable changes of the process chamber 100, the method 1000, and/or the method 1100. For example, if variable "A" is adjusted to cause a change in aspect "B" of the process, and such an adjustment unintentionally causes a change in aspect "C" of the process, then the one or more machine learning algorithms and/or artificial intelligence algorithms may take such a change of aspect "C" into account. In such an embodiment, the one or more machine learning algorithms and/or artificial intelligence algorithms embody predictive aspects related to implementing the process chamber 100, the method 1000, and/or the method 1100. The predictive aspects can be utilized to preemptively mitigate unintended changes within a processing system.

The one or more machine learning algorithms and/or artificial intelligence algorithms can use, for example, a regression model (such as a linear regression model) or a clustering technique to estimate optimized parameters. The algorithm can be unsupervised or supervised. The one or more machine learning algorithms and/or artificial intelligence algorithms can optimize, for example, a heating power applied to the heat sources 141, 143, a cleaning recipe, and/or a processing recipe. The one or more machine learning algorithms and/or artificial intelligence algorithms can optimize, for example, the pre-determined thickness and/or the second pre-determined thickness discussed herein, a time for initiating a cleaning operation, and/or a time for initiating a deposition operation.

In one or more embodiments, the controller 190 automatically conducts the operations described herein without the use of one or more machine learning algorithms or artificial intelligence algorithms. In one or more embodiments, the controller 190 compares measurements (such as of the reading increase and/or the reading decrease) to data in a look-up table and/or a library to determine if the coating condition and/or the cleaning condition are detected. The controller 190 can stored measurements as data in the look-up table and/or the library.

Figure 2:
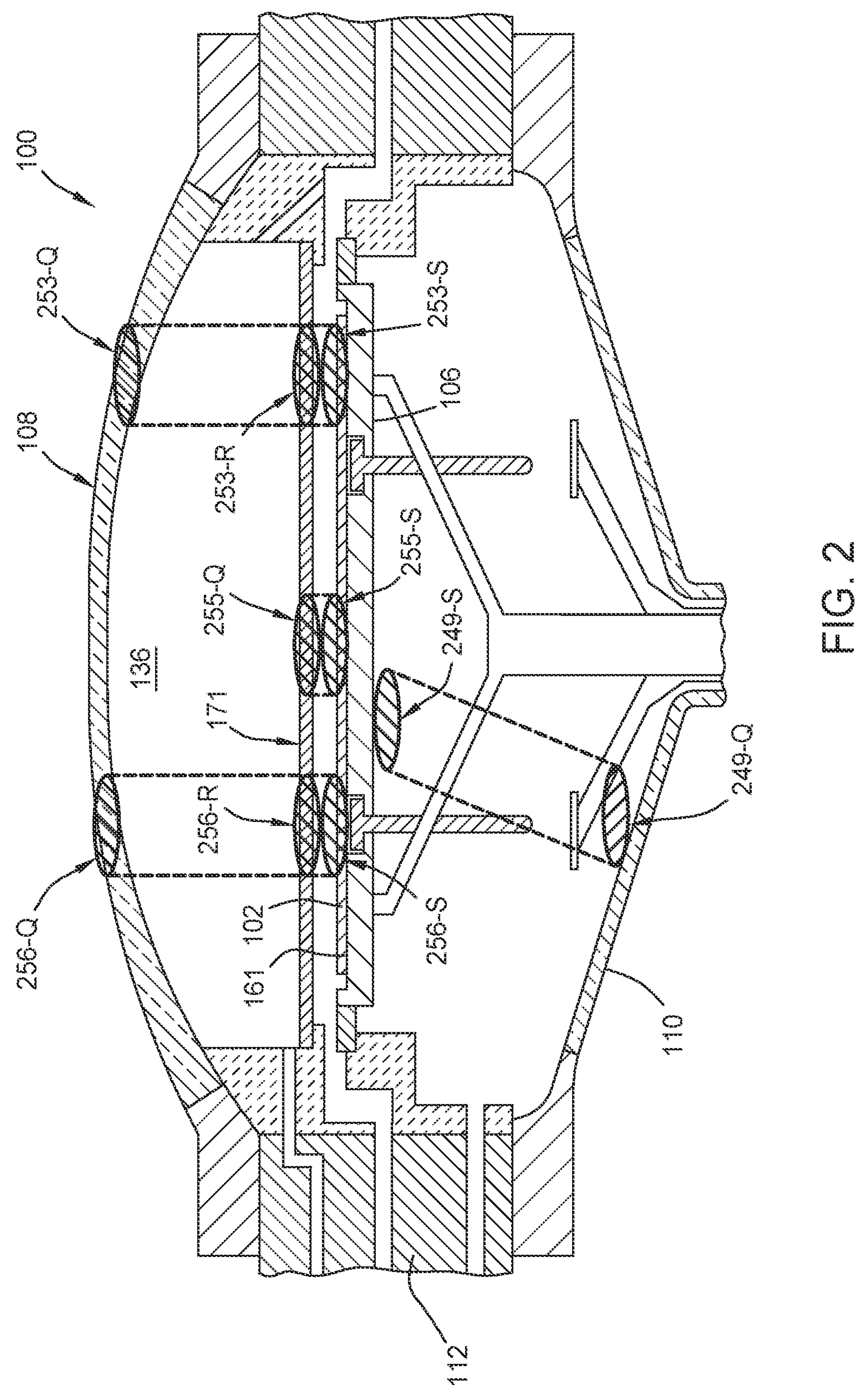
FIG. 2 is a schematic enlarged view of the processing chamber shown in FIG. 1, according to one or more embodiments.

FIG. 2 is a schematic enlarged view of the processing chamber 100 shown in FIG. 1, according to one or more embodiments. The substrate support 106 has an upper surface 161 (e.g., a support surface) and a lower surface 169.

FIG. 2 also illustrates a plurality of temperature measurement sites 249-Q, 249-S, 253-Q, 253-R, 253-S, 255-Q, 255-S, 256-Q, 256-R, 256-S. For example, in one or more embodiments, the lower sensor device 195 (shown in FIG. 1) is configured to measure temperatures at site 249-Q (e.g., at a middle peripheral region of the lower window 110) and/or site 249-S (e.g., at a middle peripheral region of the lower surface 169 of the substrate support 106). In one or more embodiments, a first upper sensor device 196 (shown in FIG. 1) is configured to measure temperatures at site 255-Q (e.g., at a central region of the plate 171) and/or site 255-S (e.g., at a central region of the substrate 102 and/or a central region of the upper surface 161 of the substrate support 106). In one or more embodiments, a second upper sensor device 197 (shown in FIG. 1) is configured to measure temperatures at site 253-Q (e.g., at an outer peripheral region of the upper window 108), at site 253-R (e.g., at an outer peripheral region of the plate 171), and/or site 253-S (e.g., at an outer peripheral region of the substrate 102 and/or an outer peripheral region of the upper surface 161 of the substrate support 106). In one or more embodiments, a third upper sensor device 198 (shown in FIG. 1) is configured to measure temperatures at site 256-Q (e.g., at an outer peripheral region of the upper window 108), at site 256-R (e.g., at an outer peripheral region of the plate 171), and/or site 256-S (e.g., at an outer peripheral region of the substrate 102 and/or an outer peripheral region of the upper surface 161 of the substrate support 106). The sensor devices 195, 196, 197, 198 may be positioned and/or oriented differently than what is shown in FIG. 1 and FIG. 2, while still capable of measuring temperatures at a site on the plate 171, a site on one or more of the windows (e.g., upper window 108 and/or lower window 110), and/or a site on one of the surfaces of substrates support 106 (e.g., upper surface 161 and/or lower surface 169) and/or the substrate 102. Each of the sensor devices 195, 196, 197, 198 may be adapted to detect energy (e.g., radiation, such as light) at two or more (such as three or more) different wavelength ranges. For example, in one or more embodiments the two or three wavelength ranges of the upper sensor devices 196, 197, 198 are selected to be (1) a wavelength range at which the plate 171 is absorptive (e.g., about 2.48 microns to about 2.98 microns), (2) a wavelength range at which the substrate support 106 and/or the substrate 102 is absorptive (e.g., about 3.17 microns to about 3.67 microns), and (3) a wavelength range at which the upper window 108 and/or the lower window 110 is absorptive (e.g., about 4.75 microns to about 5.25 microns, such as about 5.0 microns). As another example, in one or more embodiments the two wavelength ranges of the lower sensor device 195 are selected to be (1) a wavelength range at which the upper window 108 and/or the lower window 110 is absorptive (e.g., about 4.75 microns to about 5.25 microns, such as about 5.0 microns), and (2) a wavelength range at which the substrate support 106 and/or the substrate 102 is absorptive (e.g., about 3.17 microns to about 3.67 microns).

Figure 3:
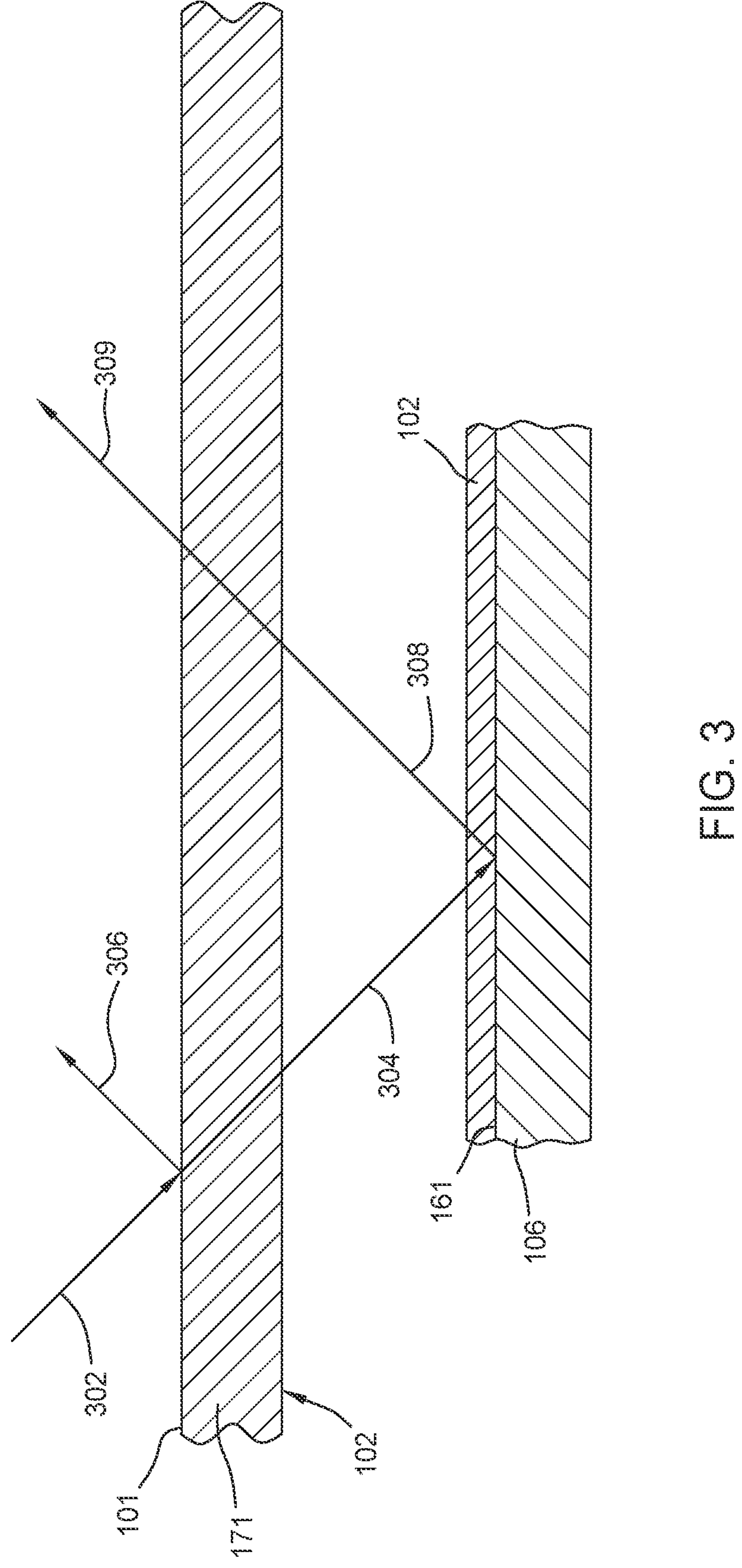
FIG. 3 illustrates a simplified schematic partial cross-sectional view of a portion of the processing chamber shown in FIG. 1, according to one or more embodiments.

FIG. 3 illustrates a simplified schematic partial cross-sectional view of a portion of the processing chamber 100 shown in FIG. 1, according to one or more embodiments. As illustrated, temperature measurement at each of the sites 249-Q, 249-S, 253-Q, 253-R, 253-S, 255-Q, 255-S, 256-Q, 256-R, and 256-S may be conducted using one or more radiation beams. In one or more embodiments, each of the sensor devices 195, 196, 197, 198 is configured to emit one or more radiation beams and receive one or more reflected radiation beams. In FIG. 3, a radiation beam 302 may be emitted by the first upper sensor device 196. At the first face 172 of the plate 171, a portion of the radiation beam 302 may be reflected as radiation beam 306. Another portion of radiation beam 302 may be transmitted as radiation beam 304. It should be appreciated that the reflected portion and the transmitted portion may be of differing wavelengths, depending on the material and the temperature of the plate 171. For example, reflected radiation beam 306 may have a wavelength in the range of about 2.48 microns to about 2.98 microns. The first upper sensor device 196 is configured to receive the reflected radiation beam 306 and measure the intensity of the radiation beam 306. For example, the first upper sensor device 196 may be configured to receive and measure, at least, radiation in the wavelength range of about 2.48 microns to about 2.98 microns. At the upper surface 161 of substrate support 106, a portion of radiation beam 304 may be reflected as radiation beam 308. Moreover, a portion of radiation beam 308 may be once again transmitted through upper window 108, resulting in radiation beam 309. It should be appreciated that the reflected portion (e.g., radiation beam 308) and the reflected-transmitted portion (e.g., radiation beam 309) may each be of certain wavelength, depending on the materials and the temperatures of the substrate support 106 and the plate 171. For example, radiation beam 309 may have a wavelength in the range of about 3.17 microns to about 3.67 microns. The first upper sensor device 196 is configured to receive the transmitted-reflected-transmitted radiation beam 309 and measure the intensity of the radiation beam 309. For example, the first upper sensor device 196 may be configured to receive and measure, at least, radiation in the wavelength range of about 3.17 microns to about 3.67 microns.

In one or more embodiments, one or more of the sensor devices 195, 196, 197, 198 may measure more than two (such as three or more) different wavelengths (or wavelength ranges) simultaneously. For example, one or more of the sensor devices 195, 196, 197, 198 may contemporaneously measure radiation in the about 3.17 micron to about 3.67 micron range, the about 2.48 micron to about 2.98 micron range, and the about 4.75 micron to about 5.25 micron range.

The temperature measurements made by each of the sensor devices 195, 196, 197, 198 are used to monitor temperatures within the process chamber 100. Moreover, the temperature measurements may be utilized to assess operational states (such as coating conditions and/or cleaning conditions) of the process chamber 100. For example, differences in temperature measurements may be utilized to detect reactant coating of the plate 171, the upper window 108, and/or the lower window 110. Such coating detection may be obtained without opening process chamber 100 for process and/or clean optimizations. For example, FIG. 4 illustrates exemplary temperature changes that might be measured for detecting a coating condition.

Figure 4:
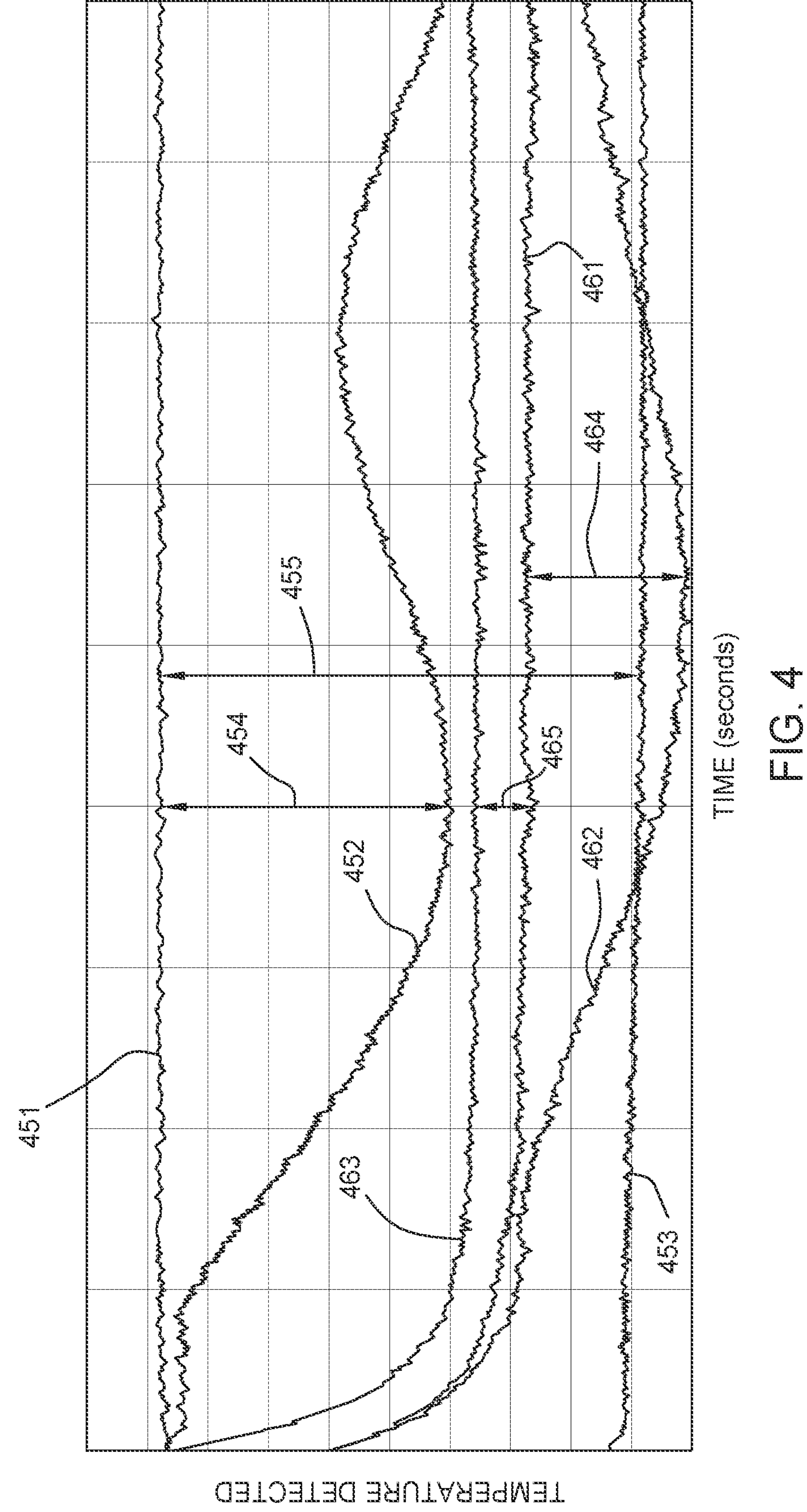
FIG. 4 is a schematic graphical view of temperature measurement profiles, according to one or more embodiments.

FIG. 4 is a schematic graphical view of temperature measurement profiles 451-456, according to one or more embodiments.

Line 451 is an exemplary temperature measurement profile of the substrate support 106 when the plate 171 is clear (e.g., before coating by reactive gases). Line 452 is an exemplary temperature measurement profile of the substrate support 106 while the plate 171 is coated by reactive gases. Line 453 is an exemplary temperature measurement profile of the substrate support 106 after the plate 171 is coated. A first change 454 (e.g., a reading decrease) in temperature readings can indicate that the plate 171 is being coated by reactive gases. A second change 455 (e.g., a reading decrease) in temperature readings can indicate that the plate 171 has been coated by reactive gases, such as by a pre-determined thickness.

Line 461 is an exemplary temperature measurement profile of the plate 171 when the plate 171 is clear (e.g., before coating by reactive gases and having a pyrometer signal showing a high transmission of energy to the substrate). Line 462 is an exemplary temperature measurement profile of the plate 171 while the plate 171 is coated by reactive gases. Line 463 is an exemplary temperature measurement profile of the plate 171 after the plate 171 is coated (e.g., having a pyrometer signal showing a low transmission of energy to the substrate). A first change 464 (e.g., a reading decrease) in temperature readings can indicate that the plate 171 is being coated by reactive gases. A second change 465 (e.g., a reading increase) in temperature readings can indicate that the plate 171 has been coated by reactive gases, such as by a pre-determined thickness.

In one or more embodiments, the controller 190 may receive temperature measurements from any of the sensor devices 195, 196, 197, 198. The controller 190 may store one or more of the temperature measurements, and can compare the stored values to one or more subsequent iterations of the temperature measurements. The controller 190 may compare any one of the temperature measurements with any one or more of the other temperature measurements. The controller 190 may assess an operational state of the process chamber 100 based on the temperature measurements and/or on the comparisons thereof. For example, the operational state may be a coating condition for the plate 171 (e.g., that the plate 171 has been coated by a pre-determined thickness). The coating condition can, for example, hinder heating efficiency, process gas flow, and/or process gas reactivity. Upon detecting the coating condition, the controller 190 can generate an alert on a display, halt a deposition operation, initiate a chamber downtime period, delay a subsequent iteration of the deposition operation, initiate a cleaning operation to remove the coating from the plate 171, and/or halt the cleaning operation.

The controller 190 may cause a change in the environment of the process chamber based on the assessment of the operational state (e.g., the detection of the coating condition). For example, the controller may adjust input power to heat sources 141, 143 in order to adjust the heating of the substrate support 106 and/or the substrate 102. The controller 190 may issue an alert based on the assessment of the operational state, and generate the alert on a display for a user to see. For example, the controller 190 may notify a user that the plate 171 is in need of a cleaning operation. As discussed above, the controller 190 may additionally or alternatively automatically initiate a cleaning operation to remove the coating from the plate 171.

In one or more embodiments, the coating condition is detected by the controller 190 when both (1) a first reading change (such as the first change 454 or the second change 455) is detected for the substrate support 106 (and/or the substrate 102); and (2) a second reading change (such as the second change 465) is detected for the plate 171 at a substantially simultaneous time as the first reading change. In one or more embodiments, the coating condition is detected by the controller 190 when both (1) a reading decrease (such as the first change 454 or the second change 455) is detected for the substrate support 106 (and/or the substrate 102); and (2) a reading increase (such as the second change 465) is detected for the plate 171 at a substantially simultaneous time as the reading decrease. For example, FIG. 4 shows the second change 465 (e.g., a reading increase for the plate 171) at a substantially simultaneous time as the first change 454 (e.g., a reading decrease for the substrate support 106 and/or the substrate 102). During a coating of the plate 171, the coating causes absorption of more energy at the plate 171, which causes an increase in temperature for the plate 171 and a decrease in temperature for the substrate support 106 and/or the substrate 102. In one or more embodiments, the reading decrease and the reading increase are at substantially simultaneous times if the two times are within a difference of 5 seconds or less (such as 1 second or less, for example 0.5 seconds or less) relative to each other along a processing timeline. By using, for example, the reading decrease and the reading increase to detect the coating condition, accurate detection of the coating condition and efficient taking of an action (such as initiating a cleaning operations) are facilitated. The present disclosure contemplates that one or more profiles (such as the line 451, the line 452, the line 453, the line 461, and/or the line 463) can be used as reference profile(s) for detecting the coating condition. The present disclosure contemplates that the coating condition can be detected in a steady state and/or in a transient state.

In one or more embodiments, a cleaning condition is detected by the controller 190 when both (1) a reading increase is detected for the substrate support 106 (and/or the substrate 102); and (2) a reading decrease is detected for the plate 171 at a substantially simultaneous time as the reading increase. The cleaning condition is detected during a cleaning operation and can indicate, example that a suitable amount of the coating has been removed such that the cleaning operation can end and deposition operations can resume. The present disclosure contemplates that one or more profiles (such as the line 451, the line 452, the line 453, the line 461, and/or the line 463) can be used as reference profile(s) for detecting the cleaning condition. The present disclosure contemplates that the cleaning condition can be detected in a steady state and/or in a transient state.

In one or more embodiments, the respective reading increases and reading decreases described herein are detected if the respective reading increase or reading decrease includes a change that is a ratio within a range of 0.00015 to 0.1, such as within a range of 0.005 to 0.1, relative to an initial temperature reading. In one or more embodiments, the coating condition or the cleaning condition is not detected if the ratio is outside the range of 0.00015 to 0.1, such as outside the range of 0.005 to 0.1.

Figure 5:
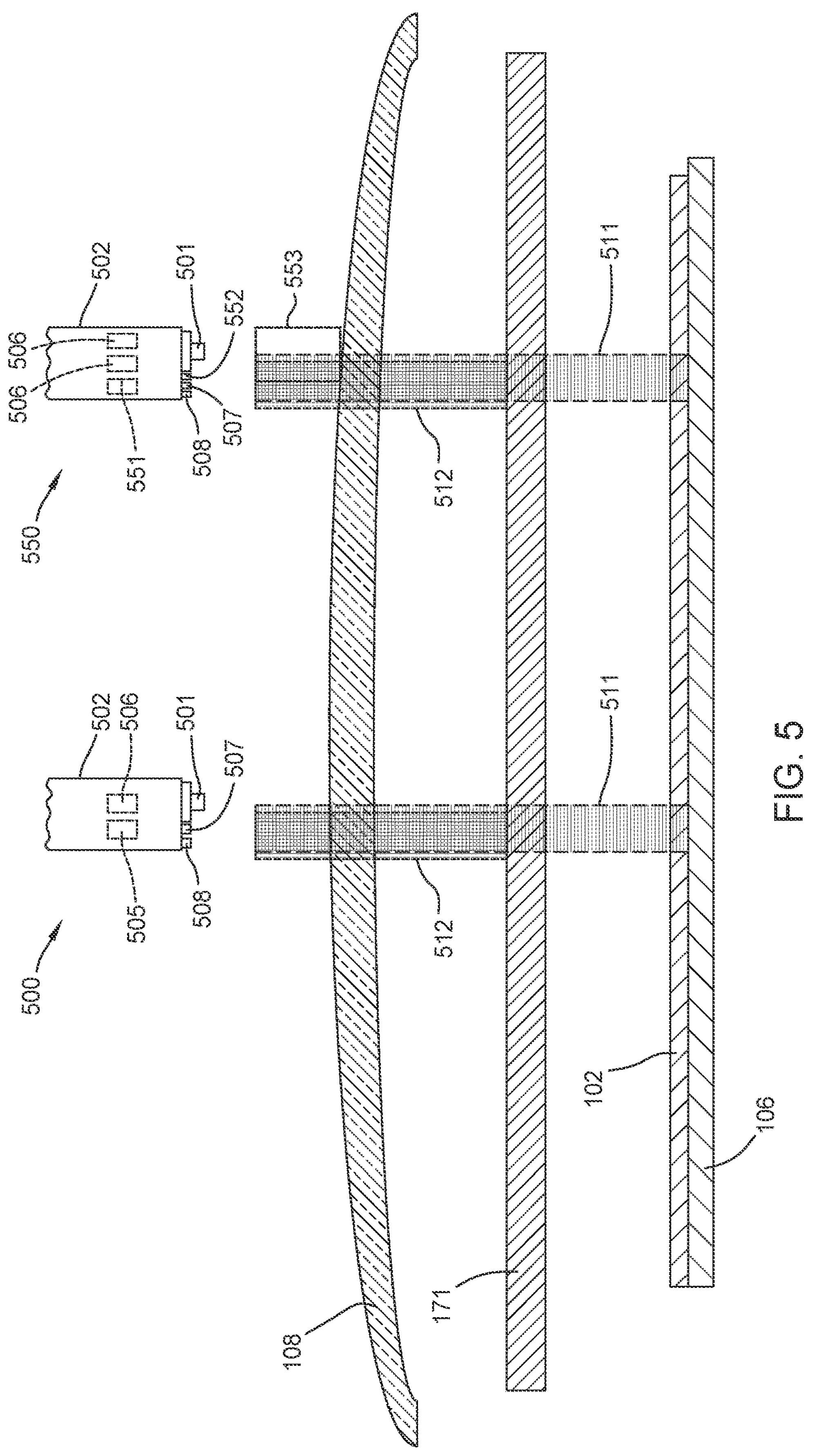
FIG. 5 is a schematic partial view of the system including the processing chamber shown in FIG. 1, according to one or more embodiments.

FIG. 5 is a schematic partial view of the system including the processing chamber 100 shown in FIG. 1, according to one or more embodiments. A sensor device 500 is disposed above the plate 171 and the upper window 108. The sensor device 500 can be used in place of one or more of the sensor devices 195, 196, 197, 198 shown in FIG. 1.

The sensor device 500 includes an eyepiece 501 mounted to a sensor housing 502. The sensor device 500 includes a first optical sensor 505 configured to detect energy having a first wavelength that is less than 4.0 microns, and a second optical sensor 506 configured to detect energy having a second wavelength that is less than the first wavelength. The optical sensor 505, 506 are disposed in the sensor housing 502. In one or more embodiments, the first wavelength is within a range of about 3.17 microns to about 3.67 microns, such as about 3.3 microns to about 3.5 microns. In one or more embodiments, the first wavelength is about 3.4 microns, such as 3.42 microns. In one or more embodiments, the second wavelength is within a range of about 2.48 microns to about 2.98 microns, such as about 2.6 microns to about 2.8 microns. In one or more embodiments, the second wavelength is about 2.7 microns, such as 2.73 microns.

The sensor device 500 includes a first light emitter 507 configured to emit a first beam 511 (e.g., light beam) toward a first area of the substrate support 106 (and/or the substrate 102). The sensor device 500 includes a second light emitter 508 configured to emit a second beam 512 (e.g., light beam) toward a second area of the plate 171. The second area of the second beam 512 overlaps with the first area of the first beam 511 by at least 80% of the first area. The second area overlaps with the first area, for example, along the vertical direction from the substrate support 106 and toward the plate 171. The eyepiece 501 is configured to collect reflected portions of the beams 511, 512 and the optical sensors 505, 506 are configured to measure the intensities of the reflected portions of the beams 511, 512 that have the respective first wavelength and second wavelength.

The upper window 108 includes a first quartz and the plate 171 includes a second quartz. The first quartz has a first hydroxyl concentration of less than 100 parts-per-million ppm). In one or more embodiments, the first hydroxyl concentration is 30 ppm or less, such as within a range of about 5 ppm to about 30 ppm. The second quartz has a second hydroxyl concentration of more than 750 parts-per-million (ppm). In one or more embodiments, the second hydroxyl concentration is 900 ppm or more. In one or more embodiments, the upper window 108 is formed of the first quartz and the plate 171 is formed of the second quartz. Other window(s), such as the lower window 110, can include the first quartz. For example, the lower window 110 can be formed of the first quartz. Using the first quartz and the second quartz facilitates accurately and efficiently measuring temperatures of the plate 171 and the substrate support 106 (and/or the substrate 102) during processing, and facilitates accurately and efficiently detecting the coating condition for the plate 171. As an example, the plate 171 having the higher second hydroxyl concentration facilitates accurately and efficiently measuring temperatures and/or coating conditions for the plate 171 using the second wavelength. Using the first quartz and the second quartz facilitates enhanced signal-to-noise ratios for the measurements. Using the first quartz, thermal non-uniformities affected by temperature gradients of the upper window 108 are reduced or eliminated. For example, gradients of the hydroxyl concentration across a diameter of the first quartz are reduced or eliminated to facilitate enhanced heating uniformity. As recited herein, the hydroxyl concentration refers to a parts-per-million (ppm) measurement of hydroxyl groups (e.g., groups including an oxygen atom covalently bonded to a hydrogen atom) in or on the respective quartz material. In one or more embodiments, the ppm measurement of the hydroxyl concentration is a measured concentration of hydroxyl groups relative to all other materials (such as contaminants and/or quartz) present on the respective quartz surfaces of the first quartz or the second quartz. In one or more embodiments, the measurement of the hydroxyl concentration is conducted by X-ray photoelectron spectroscopy (XPS) and provided in the unit of ppm. The present disclosure contemplates that other measurement techniques, such as glow discharge mass spectroscopy (GDMS), may be used to measure the ppm values of the hydroxyl concentration.

In one or more embodiments, at least a portion of the shaft 118 and/or the arms 119 include the first quartz (such as are formed of the first quartz). In one or more embodiments, at least a portion of the shaft 135, the arms 139 and/or the lift pin stops 134 include the first quartz (such as are formed of the first quartz).

The hydroxyl concentrations can be affected, for example, by the water content and/or contamination content in the respective first quartz or second quartz. The higher hydroxyl concentration of the second quartz involves a lower transmission of energy having the second wavelength. The higher hydroxyl concentration of the second quartz involves a higher transmission of energy having the first wavelength.

In one or more embodiments, the first quartz is transmissive for the first wavelength and the second wavelength discussed herein. In one or more embodiments, the second quartz is transmissive for the first wavelength and is absorptive for the second wavelength. In one or more embodiments, the material of the substrate support 106 is absorptive for the first wavelength. The first quartz facilitates reduced absorption and increased transmission (for the first wavelength and the second wavelength), and reduced power expenditures for heating. The first quartz can have a higher transmission (e.g., by over 5%) for infrared light relative to other materials, at a temperature of about 1000 degrees Celsius. The first quartz can facilitate for example, a power savings of over 5 KW per 100 KW expended. The first quartz facilitates increased heat ramp rates and increased throughput.

In one or more embodiments, the first quartz is transmissive for 75% or more (such as 80% or more) of energy (e.g., light) having the second wavelength. In one or more embodiments, the second quartz is transmissive for less than 5% (such as about 0%) of energy (e.g., light) having the second wavelength. The first quartz is fused quartz, such as electrically fused quartz. The second quartz is synthetic quartz, such as quartz formed using a soot process.

The sensor device 500 is shown as a multi-wavelength (e.g., dual-wavelength) sensor device. The present disclosure contemplates that the first optical sensor 505 can be disposed in a first sensor housing of a first sensor device, the first light emitter 507 can be mounted to the first sensor housing, the second optical sensor 506 can be disposed in a second sensor housing of a second sensor device, and the second light emitter 508 can be mounted to the second sensor housing. A first eyepiece can be mounted to the first sensor housing, and a second eyepiece can be mounted to the second sensor housing. The first sensor housing and the second sensor housing are positioned in relation to each other such that the first optical beam 511 overlaps (as described above) with the second optical beam 512 by at least 80%.

In addition to or in place of the sensor device 500, a sensor device 550 is disposed above the plate 171 and the upper window 108. The sensor device 550 can be used in place of one or more of the sensor devices 195, 196, 197, 198 shown in FIG. 1. The sensor device 550 includes a third optical sensor 551 configured to detect energy having a third wavelength that is greater than the first wavelength. The optical sensor 551 are disposed in the sensor housing 502. In one or more embodiments, the third wavelength is within a range of about 4.75 microns to about 5.25 microns, such as about 4.9 microns to about 5.1 microns. In one or more embodiments, the third wavelength is about 5.0 microns.

The sensor device 550 includes a third light emitter 552 configured to emit a third beam 553 (e.g., light beam) toward a third area of the upper window 108. The sensor device 550 includes the first light emitted 507 and the second light emitter 508. In one or more embodiments, the third area of the third beam 553 overlaps with the first area of the first beam 511 by at least 80% of the first area. The third area overlaps with the first area, for example, along the vertical direction from the substrate support 106 and toward the upper window 108. The eyepiece 501 is configured to collect reflected portions of the beams 511, 512, 553 and the optical sensors 505, 506, 551 are configured to measure the intensities of the reflected portions of the beams 511, 512, 553 that have the respective first wavelength, second wavelength, and third wavelength. Measuring the third beam 553 using the third wavelength can be used to determine a coating condition for the upper window 108. The lower hydroxyl concentration of the third quartz involves a lower transmission of energy having the third wavelength. In one or more embodiments, the first quartz is absorptive for the third wavelength. In one or more embodiments, the first quartz is transmissive for less than 5% (such as about 0%) of energy (e.g., light) having the third wavelength.

The sensor device 550 is shown as a multi-wavelength (e.g., triple-wavelength) sensor device. The present disclosure contemplates that the first optical sensor 505 can be disposed in a first sensor housing of a first sensor device, the first light emitter 507 can be mounted to the first sensor housing, the second optical sensor 506 can be disposed in a second sensor housing of a second sensor device, the second light emitter 508 can be mounted to the second sensor housing, the third optical sensor 551 can be disposed in a third sensor housing of a third sensor device, the third light emitter 552 can be mounted to the third sensor housing. A first eyepiece can be mounted to the first sensor housing, a second eyepiece can be mounted to the second sensor housing, and a third eyepiece can be mounted to the third sensor housing. The first sensor housing the second sensor housing, and the third sensor housing are positioned in relation to each other such that the first optical beam 511 overlaps (as described above) with the second optical beam 512 by at least 80%, and the third optical beam 553 overlaps (as described above) with the first optical beam 511 by at least 80%.

Figure 6:
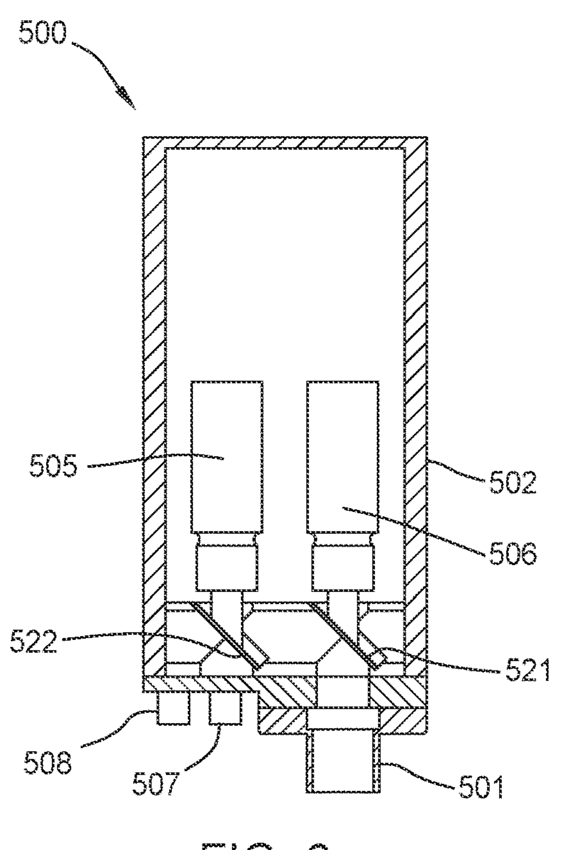
FIG. 6 is a schematic enlarged cross-sectional view of the sensor device shown in FIG. 5, according to one or more embodiments.

FIG. 6 is a schematic enlarged cross-sectional view of the sensor device 500 shown in FIG. 5, according to one or more embodiments.

The sensor device 500 includes a beam splitter 521 (such as a mirror) configured to transmit the energy (e.g., the reflected portion of the second beam 512) having the second wavelength therethrough and toward the second optical sensor 506, and reflect the energy (e.g., the reflected portion of the first beam 511) having the first wavelength. In one or more embodiments, a mirror 522 (such as a second beam splitter) is configured to reflect the energy (e.g., the reflected portion of the first beam 511) having the first wavelength toward the first optical sensor 505. In one or more embodiments, the mirror 522 reflects about 95% or more of energy incident on the mirror 522.

Figure 7A:
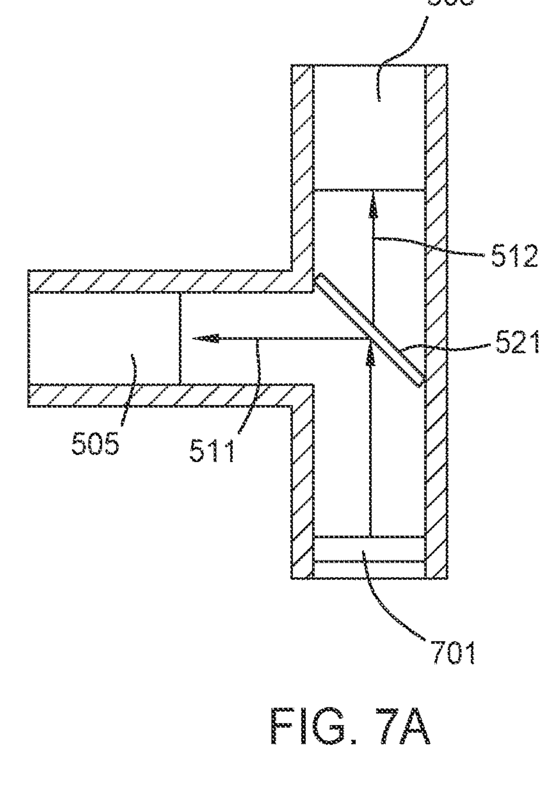
FIG. 7A is a schematic plan view of the optical paths in the sensor device of the respective reflected portions of the first beam and the second beam shown in FIG. 5, according to one or more embodiments. In one or more embodiments, the sensor device includes a lens 701 (such as a collimating lens) that collects energy.

FIG. 7A is a schematic plan view of the optical paths in the sensor device 500 of the respective reflected portions of the first beam 511 and the second beam 512 shown in FIG. 5, according to one or more embodiments.

After being collected through the eye piece 501, the reflected portions of the first beam 511 and the second beam 512 travel to the beam splitter 521. The reflected portion of the first beam 511 having the first wavelength reflects off of the beam splitter 521 along a path toward the first optical sensor 505. The reflected portion of the first beam 511 having the first wavelength transmits through the beam splitter 521 along a path toward the first optical sensor 505.

Figure 7B:
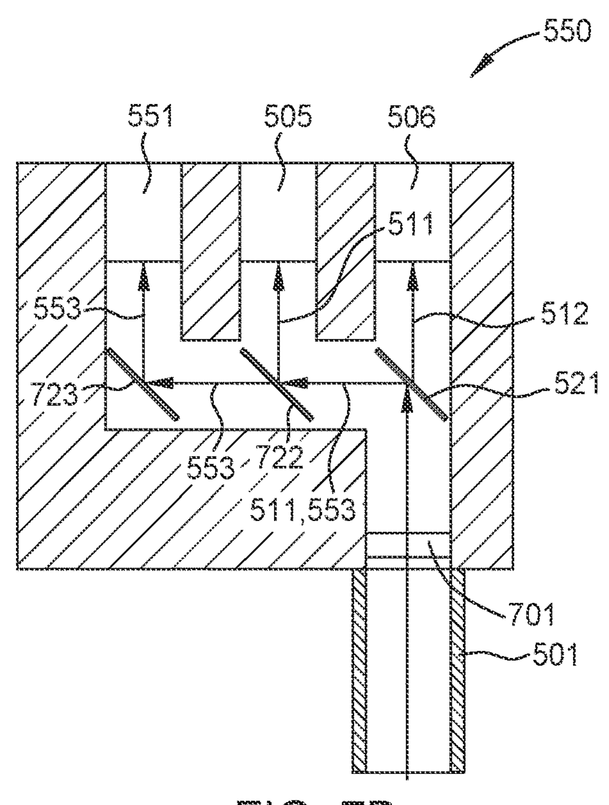
FIG. 7B is a schematic plan view of the optical paths in the sensor device of the respective reflected portions of the first beam, the second beam, and the third beam shown in FIG. 5, according to one or more embodiments.

FIG. 7B is a schematic plan view of the optical paths in the sensor device 550 of the respective reflected portions of the first beam 511, the second beam 512, and the third beam 553 shown in FIG. 5, according to one or more embodiments. The sensor device 550 includes the beam splitter 521, the second beam splitter 722, and a mirror 723 (such as a beam splitter).

In one or more embodiments, the beam splitter 521 is configured to transmit at least 90% of the reflected portion of the second beam 512 and reflect at least 90% of the reflected portions of the first beam 511 and the third beam 553. In one or more embodiments, the second beam splitter 722 is configured to transmit at least 95% of the reflected portion of the third beam 553 and reflect at least 95% of the reflected portion of the first beam 511. In one or more embodiments, the mirror 723 is configured to reflect at least 95% of the reflected portion of the third beam 553.

Figure 8:
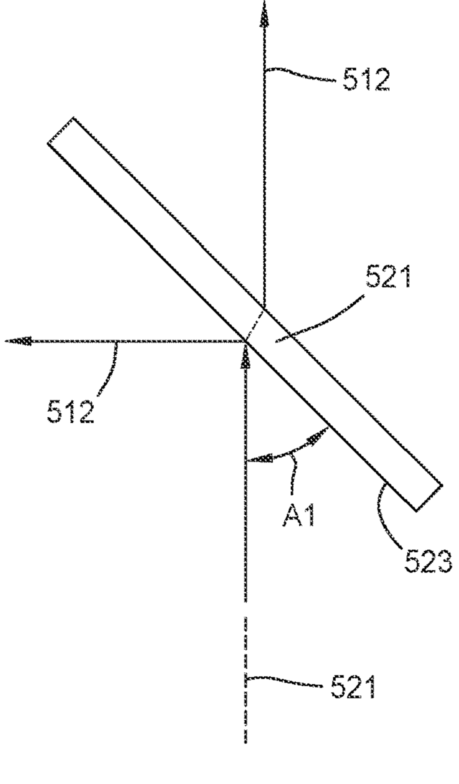
FIG. 8 is a schematic side view of the beam splitter shown in FIGS. 6 and 7, according to one or more embodiments.

FIG. 8 is a schematic side view of the beam splitter 521 shown in FIGS. 6 and 7, according to one or more embodiments.

The beam splitter 521 is oriented such that a surface 523 facing the incoming reflected energy is at an angle A1 relative to a longitudinal axis of the eyepiece 501. In one or more embodiments, the angle A1 is within a range of about 40 degrees to about 50 degrees. In one or more embodiments, the angle A1 is about 45 degrees.

Figure 9A:
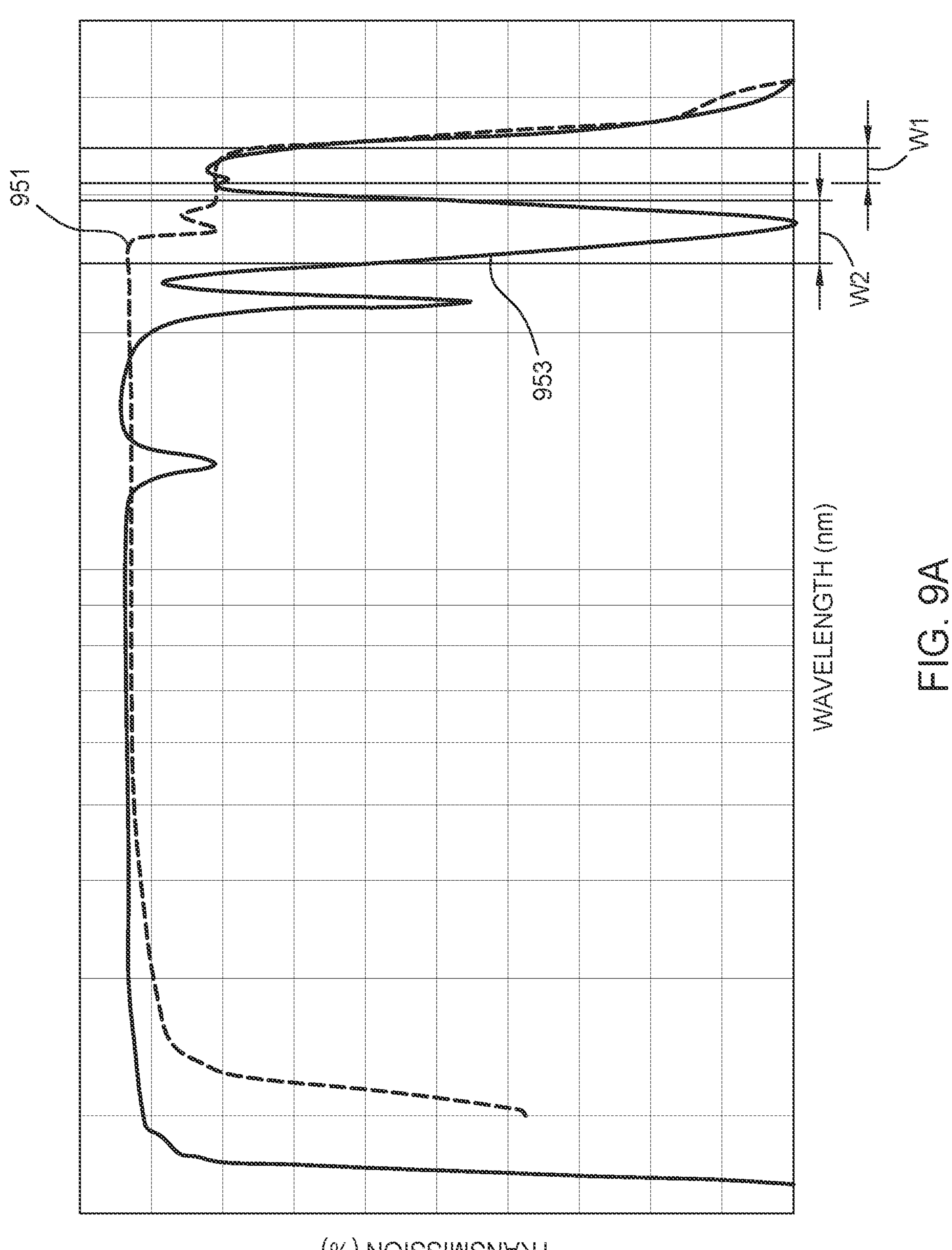
FIG. 9A is a schematic graphical view of transmission profiles, according to one or more embodiments.

FIG. 9A is a schematic graphical view of transmission profiles 951-953, according to one or more embodiments. The transmission profiles 951-953 are shown across a plurality of wavelengths. Line 951 is an exemplary transmission profile of the upper window 108. Line 951 is an exemplary transmission profile of the upper window 108. Line 953 is an exemplary transmission profile of the plate 171. As shown at the first wavelength W1 (discussed above as, for example, a range), energy having the first wavelength W1 can transmit both through the upper window 108 and the plate 171 to reach the substrate 102 and/or the substrate support 106). At the first wavelength W1, the upper window 108 and the plate 171 both have a relatively high transmission (e.g., 80% or higher).

As shown at the second wavelength W2 (discussed above as, for example, a range), energy having the second wavelength W2 can transmit through the upper window 108 and be absorbed and/or reflected by the plate 171. At the second wavelength W1, the upper window 108 has a relatively high transmission (e.g., 80% or higher) and the plate 171 has a relatively low transmission (e.g., less than 80%, such as less than 50%, less than 20%, or less than 10%, for example 5% or less, such as about 0%).

Figure 9B:
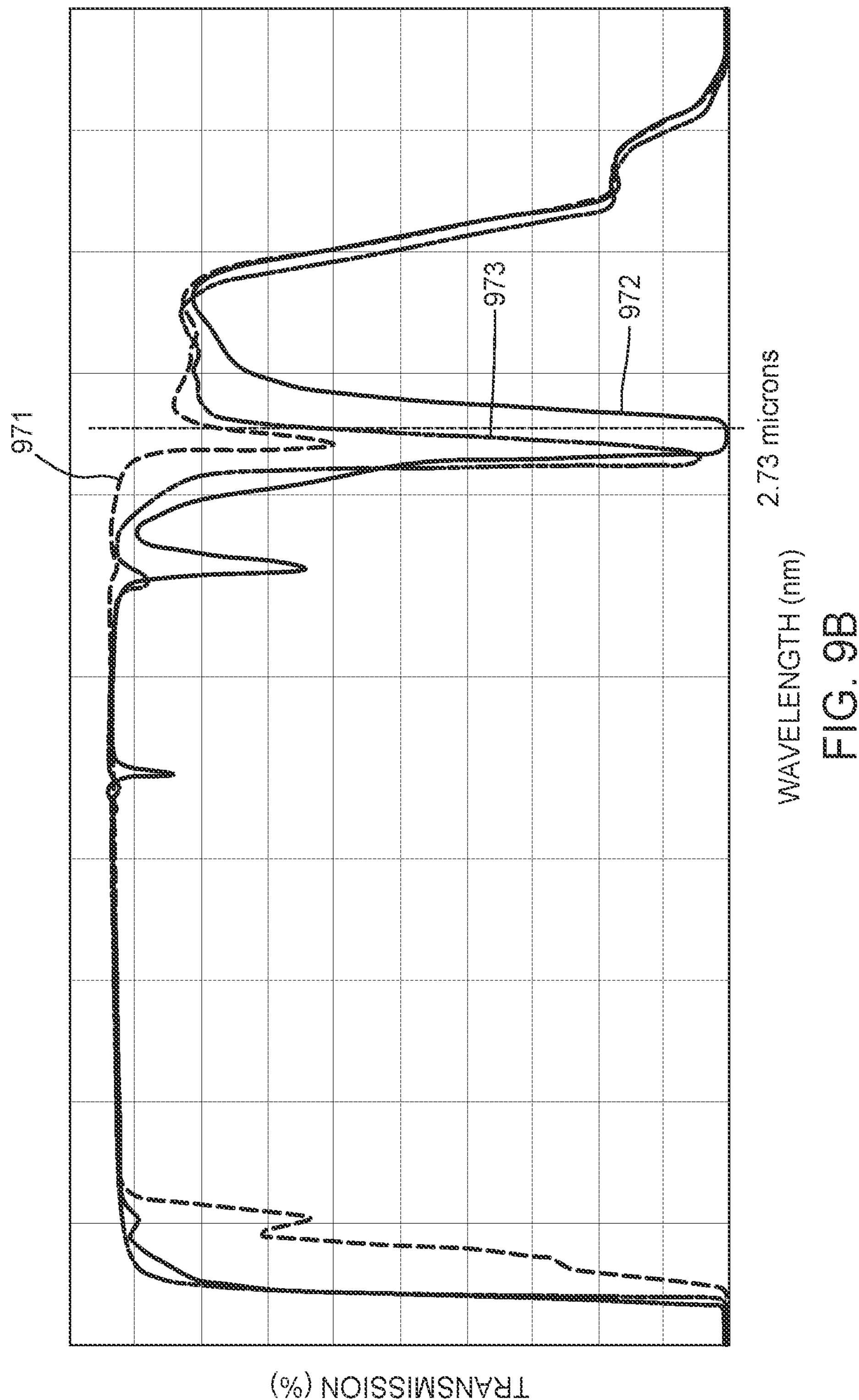
FIG. 9B is a schematic graphical view of transmission profiles, according to one or more embodiments.

FIG. 9B is a schematic graphical view of transmission profiles 971-973, according to one or more embodiments. The transmission profiles 971-973 are shown across a plurality of wavelengths. Line 971 is an exemplary transmission profile of the first quartz described above. Line 972 is an exemplary transmission profile of the second quartz described above. Line 973 is an exemplary transmission profile of a third quartz. As shown at a wavelength of about 2.73 microns (e.g., in the second wavelength range described above), the line 971 has a transmissivity of that is 75% or higher (such as 80% or higher). The line 972 has a transmissivity that is less than 5% (such as about 0%). The line 973 has a transmissivity that is within a range of 55% to 70%. The line 971 is for fused quartz that is formed using electrical fusion. The line 972 is a synthetic quartz formed using a soot process. The line 973 is a fused quartz formed using flame fusion.

As shown at the wavelength of about 2.73 microns, the first line 971 (e.g., for the upper window 108) has a relatively high transmission and the second line 973 (e.g., for the plate 171) has a relatively low transmission.

Figure 10:
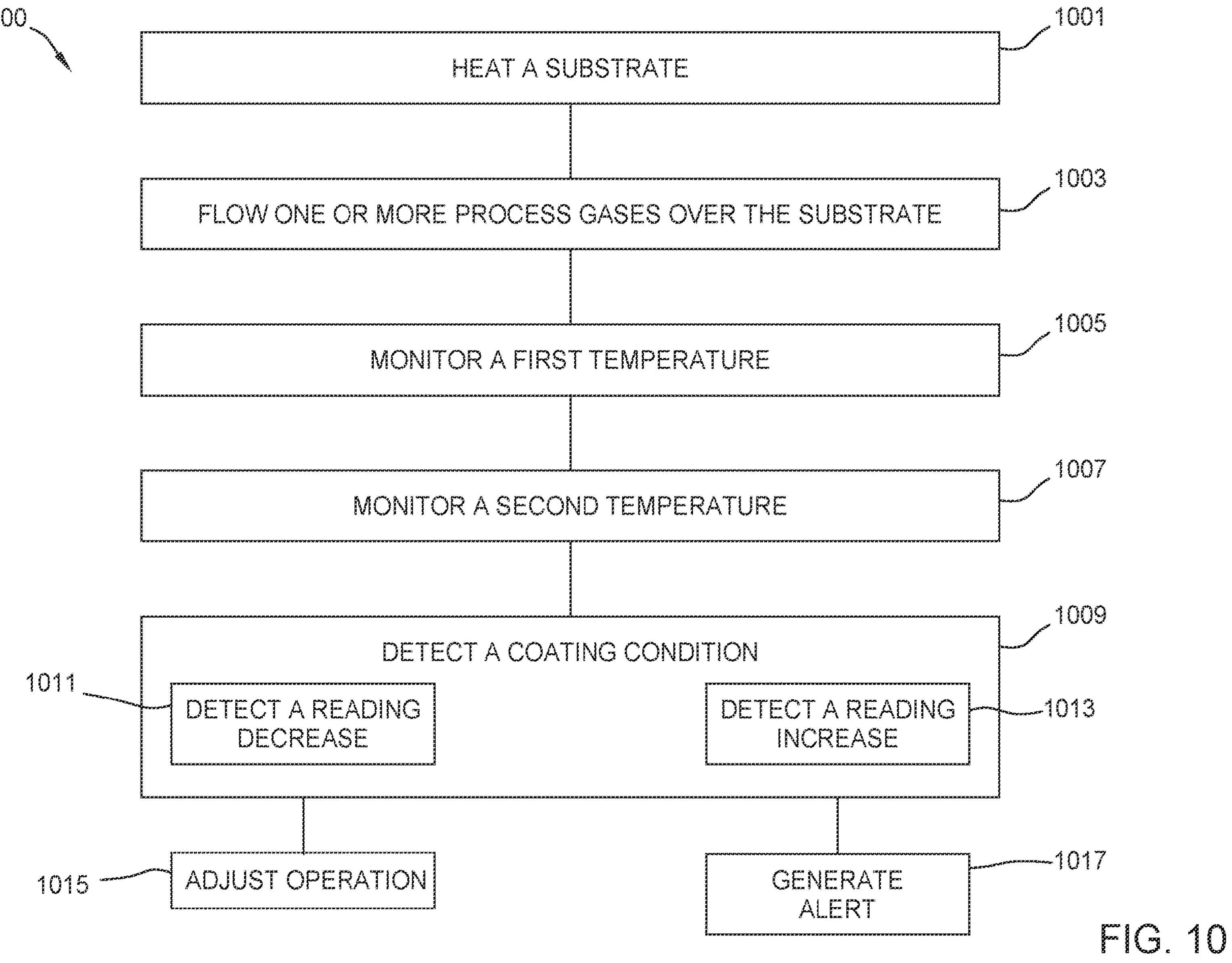
FIG. 10 is a schematic block diagram view of a method of substrate processing, according to one or more embodiments.

FIG. 10 is a schematic block diagram view of a method 1000 of substrate processing, according to one or more embodiments.

Operation 1001 of the method 1000 includes heating a substrate supported at least partially by a substrate support. In one or more embodiments, the substrate is positioned on the substrate support. In one or more embodiments, the substrate is positioned on a substrate carrier that is positioned on the substrate support.

Operation 1003 includes flowing one or more process gases over the substrate to form one or more layers on the substrate. The flowing of the one or more process gases over the substrate includes guiding the one or more process gases through a gap between the substrate and the volume boundary. In one or more embodiments, the volume boundary is a ceiling. The ceiling can be defined by the second face 173 of the plate 171, for example.

Operation 1005 includes monitoring a first temperature of the substrate or the substrate support using the first optical sensor. In one or more embodiments, the monitoring of the first temperature includes detecting energy having a first wavelength within a range of 3.17 microns to 3.67 microns.

Operation 1007 includes monitoring a second temperature of the plate using the second optical sensor. In one or more embodiments, the monitoring of the second temperature includes detecting energy having a second wavelength within a range of 2.48 microns to 2.98 microns Operation 1009 includes detecting a coating condition for the plate. In one or more embodiments, the detecting of the coating condition includes (at operation 1011) detecting a reading decrease of the first temperature, and (at operation 1013) detecting a reading increase of the second temperature at a substantially simultaneous time as the reading decrease. In one or more embodiments, the coating condition is a pre-determined thickness by which the second face 173 and/or the first face 172 of the plate 171 is coated by reactive process gases.

Operation 1015 includes adjusting operation. The adjusting can include one or more of: adjusting an operating parameter (such as an input power supplied to at least one of the heat sources of the chamber); halting the deposition of operation 1003, initiating a chamber downtime period; initiating a preventive maintenance operation (such as including an open chamber operation); delaying a subsequent iteration of the deposition, and/or initiating a cleaning operation using a cleaning recipe (such as the operation 1103 of the method 1100 to clean the chamber).

Operation 1017 includes generating an alert. For example, the alert may indicate a cleaning instruction for the plate. In one or more embodiments, the cleaning instruction instructs an operator (such as on a display of a user interface) to mitigate coating on the plate. The plate may be cleaned before the buildup degrades processing efficiency. In one or more embodiments, the cleaning instruction provides the operator with an estimate of the coating progression, such as the remaining useful chamber operation time before severe degradation of processing efficiency. The operator may use such estimate of the coating progression in order to plan and execute appropriate maintenance activities to reduce machine downtime, reduce costs and resource expenditure, and increase throughput of substrates using the process chamber.

Figure 11:
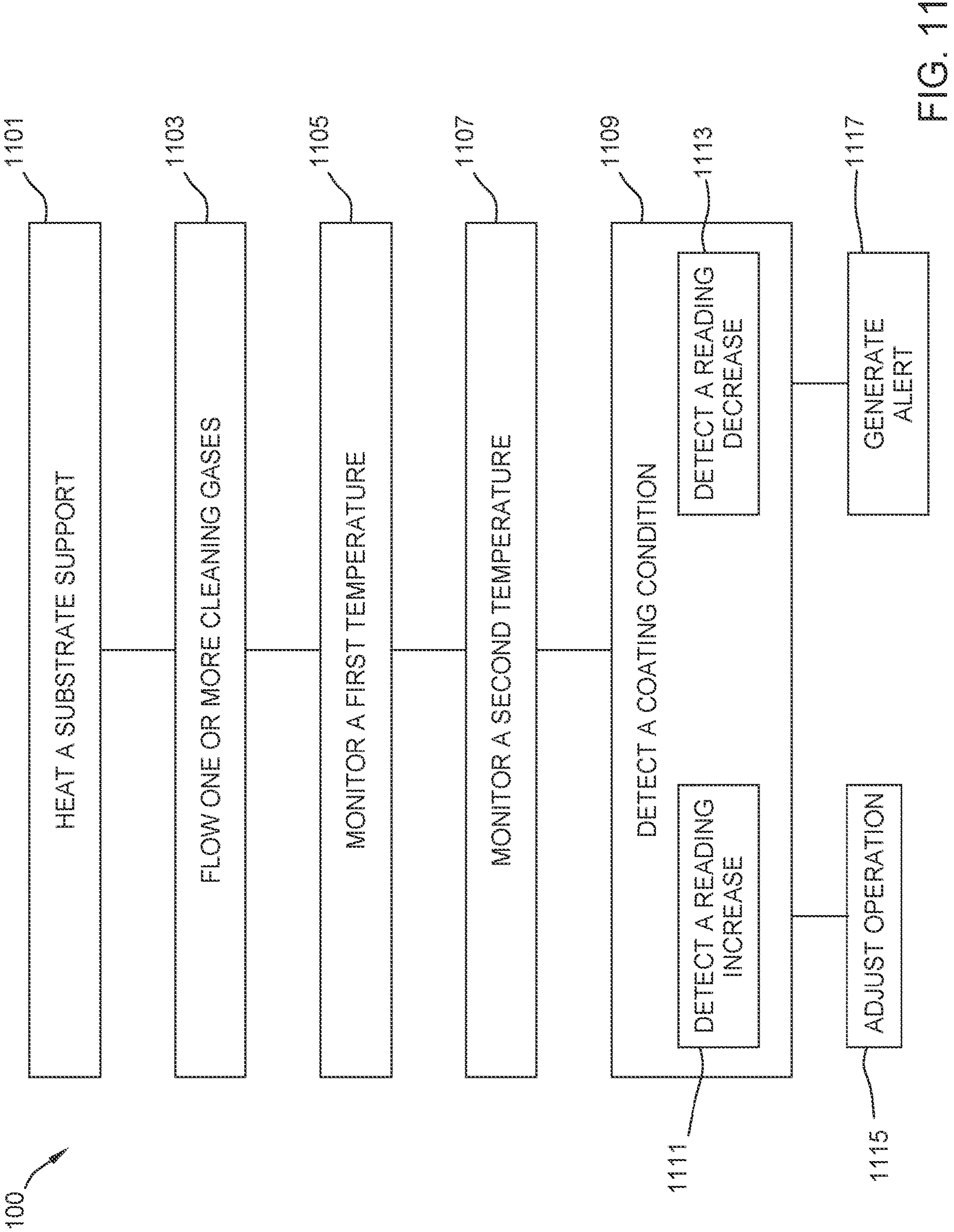
FIG. 11 is a schematic block diagram view of a method of chamber cleaning, according to one or more embodiments.

FIG. 11 is a schematic block diagram view of a method 1100 of chamber cleaning, according to one or more embodiments. The method 1100 can be conducted, for example, before or after the method 1000 of substrate processing.

Operation 1101 of the method 1100 includes heating the substrate support.

Operation 1103 includes flowing one or more cleaning gases over the plate and/or the substrate support to remove a coating from the plate and/or the substrate support. The one or more cleaning gases can flow, for example through the lower portion 136*a* and/or the upper portion 136*b*.

Operation 1105 includes monitoring a first temperature of the substrate support using the first optical sensor. In one or more embodiments, the monitoring of the first temperature includes detecting energy having a first wavelength within a range of 3.17 microns to 3.67 microns.

Operation 1107 includes monitoring a second temperature of the plate using the second optical sensor. In one or more embodiments, the monitoring of the second temperature includes detecting energy having a second wavelength within a range of 2.48 microns to 2.98 microns Operation 1109 includes detecting a cleaning condition for the plate. In one or more embodiments, the detecting of the cleaning condition includes (at operation 1111) detecting a reading increase of the first temperature, and (at operation 1113) detecting a reading decrease of the second temperature at a substantially simultaneous time as the reading increase. In one or more embodiments, the cleaning condition is a second pre-determined thickness (e.g., lower than the pre-determined thickness of the coating condition). At the cleaning condition, the coating on the plate is reduced to or below the second pre-determined thickness.

Operation 1115 includes adjusting operation. The adjusting can include one or more of: adjusting an operating parameter (such as an input power supplied to at least one of the heat sources of the chamber); halting the cleaning of operation 1103, initiating a chamber downtime period; initiating a preventive maintenance operation (such as including an open chamber operation); delaying a subsequent iteration of the cleaning, and/or initiating a deposition operation using a deposition recipe (such as the operation 1003 of the method 1000 to deposit layer(s) on the substrate).

Operation 1117 includes generating an alert. For example, the alert may indicate that the cleaning of operation 1103 can end. In one or more embodiments, the alert instructs an operator (such as on a display of a user interface) to initiate deposition operations.

The information of the method 1000 and/or the method 1100 (such as the first temperature, the second temperature the reading increase, and/or the reading decrease) can be stored and tracked as data. In one or more embodiments, the data is analyzed and/or compared using averages, derivatives, modeling, imaging, and/or with other data analysis techniques. As an example, the optical sensors 505, 506 can capture images, and the intensity of the images can be analyzed for detection of the first and second temperatures.

Benefits of the present disclosure include accurate, quick, efficient, and automatic detection of the temperature of the substrate support 106 (and/or the substrate 102) and the temperature of the plate 171; accurate, quick, efficient, and automatic detection of a coating condition for the plate 171; accurate, quick, efficient, and automatic detection of a cleaning condition for the plate 171; reduced diversive flow of gases away from the substrate 102 and the substrate support 106; adjustability of parameters (such as temperatures, gas flow paths, gas flow rates, and/or gas pressures) across a variety of operation conditions (such as low rotation speeds, high pressures, and/or low flow rates); broader and/or more modular ranges of adjustability; and increased deposition uniformity. Benefits of the present disclosure also include reduced chamber footprints; reduced or eliminated chamber component contamination; reduced cleaning, and increased ease of cleaning; increased component lifespan; reduced chamber downtime; and increased throughput. Benefits of the present disclosure also include enhanced deposition repeatability and/or cleaning repeatability.

As an example, the implementations of the present disclosure are modular and can be used across a variety of processing (e.g., deposition) operations and/or cleaning operations, including across a variety of operation parameters.

It is contemplated that one or more aspects disclosed herein may be combined. As an example, one or more aspects, features, components, operations and/or properties of the processing chamber 100, the controller 190, the one or more sensor devices 195, 196, 197, 198, the profiles in FIG. 4, the sensor device 500, the profiles in FIG. 9A, the profiles in FIG. 9B, the method 1000, and/or the method 1100 may be combined. For example, the operations and/or parameters described in relation to FIG. 4 can be combined with the operations and/or the parameters of the method 1000 and/or the method 1100. Moreover, it is contemplated that one or more aspects disclosed herein may include some or all of the aforementioned benefits.

While the foregoing is directed to embodiments of the present disclosure, other and further embodiments of the disclosure may be devised without departing from the basic scope thereof, and the scope thereof is determined by the claims that follow.

What is claimed is:

1. A system for processing substrates and applicable for semiconductor manufacturing, the system comprising:

a chamber body comprising one or more sidewalls;

a lid;

a window, the one or more sidewalls, the window, and the lid at least partially defining an internal volume, the window comprising a first quartz;

one or more heat sources configured to heat the internal volume;

a substrate support disposed in the internal volume, the substrate support comprising a support surface facing the window;

a plate disposed in the internal volume between the window and the support surface of the substrate support, the plate comprising a second quartz having a different atomic composition than the first quartz;

a first optical sensor configured to detect energy having a first wavelength that is less than 4.0 microns; and a second optical sensor configured to detect energy having a second wavelength that is less than the first wavelength.

2. The system of claim 1, wherein the first wavelength is within a range of 3.17 microns to 3.67 microns.

3. The system of claim 2, wherein the second wavelength is within a range of 2.48 microns to 2.98 microns.

4. The system of claim 3, further comprising a beam splitter configured to:

transmit the energy having the second wavelength; and reflect the energy having the first wavelength.

5. The system of claim 3, further comprising a controller comprising instructions that, when executed, cause a plurality of operations to be conducted, the plurality of operations comprising:

heating a substrate supported at least partially by the substrate support;

flowing one or more process gases over the substrate to form one or more layers on the substrate;

monitoring a first temperature of the substrate or the substrate support using the first optical sensor; and monitoring a second temperature of the plate using the second optical sensor.

6. The system of claim 5, wherein the plurality of operations further comprises detecting a coating condition for the plate, the detecting comprising:

detecting a first reading increase of the first temperature; and detecting a second reading increase of the second temperature at a substantially simultaneous time as the first reading increase.

7. The system of claim 1, further comprising:

a first light emitter configured to emit a first light beam toward a first area; and a second light emitter configured to emit a second light beam toward a second area, wherein the second area overlaps with the first area by at least 80% of the first area.

8. The system of claim 1, wherein the different atomic composition includes a different hydroxyl content.

9. The system of claim 8, wherein the second quartz has a second hydroxyl concentration of more than 750 ppm.

10. The system of claim 9, wherein the first quartz has a first hydroxyl concentration of less than 100 parts-per-million (ppm).

11. The system of claim 10, wherein the second hydroxyl concentration is 900 ppm or more.

12. The system of claim 11, wherein the first hydroxyl concentration is 30 ppm or less.

13. A system for processing substrates and applicable for semiconductor manufacturing, the system comprising:

a chamber body comprising one or more sidewalls;

a lid;

a window, the one or more sidewalls, the window, and the lid at least partially defining an internal volume, and the window comprising a first quartz;

one or more heat sources configured to heat the internal volume;

a substrate support disposed in the internal volume, the substrate support comprising a support surface facing the window; and a plate disposed in the internal volume between the support surface of the substrate support and the window, the plate comprising a second quartz, and the second quartz having an hydroxyl concentration of more than 750 ppm.

14. The system of claim 13, wherein the first quartz has an hydroxyl concentration of less than 100 parts-per-million (ppm).

15. The system of claim 14, wherein the plate is disposed between the substrate support and the window.

16. The system of claim 15, wherein the plate divides a volume between the substrate support and the window into a lower portion and an upper portion.

17. The system of claim 16, further comprising a controller comprising instructions that, when executed, cause a plurality of operations to be conducted, the plurality of operations comprising:

heating a substrate supported at least partially by the substrate support;

flowing one or more process gases over the substrate and in the lower portion to form one or more layers on the substrate;

monitoring a first temperature of the substrate or the substrate support using a first optical sensor; and monitoring a second temperature of the plate using a second optical sensor.

18. A system for processing substrates and applicable for semiconductor manufacturing, the system comprising:

a chamber body comprising one or more sidewalls;

a lid;

a window, the one or more sidewalls, the window, and the lid at least partially defining an internal volume;

one or more heat sources configured to heat the internal volume;

a substrate support disposed in the internal volume;

a plate disposed in the internal volume between the substrate support and the window; and a controller comprising instructions that, when executed, cause a plurality of operations to be conducted, the plurality of operations comprising:

heating a substrate supported at least partially by the substrate support, flowing one or more process gases over the substrate to form one or more layers on the substrate, monitoring a first temperature of the substrate or the substrate support using a first optical sensor, and monitoring a second temperature of the plate using a second optical sensor.

19. The system of claim 18, wherein:

the monitoring of the first temperature comprises detecting energy having a first wavelength within a range of 3.17 microns to 3.67 microns; and the monitoring of the second temperature comprises detecting energy having a second wavelength within a range of 2.48 microns to 2.98 microns.

* * * * *